United States Patent
Seydel

(10) Patent No.: US 7,024,954 B1
(45) Date of Patent: Apr. 11, 2006

(54) MICROELECTRONIC WAFER EXAMINATION APPARATUS AND METHOD FOR USING THE SAME

(75) Inventor: Keith B Seydel, Coon Rapids, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 184 days.

(21) Appl. No.: 10/341,813

(22) Filed: Jan. 14, 2003

(51) Int. Cl.
*G01N 19/00* (2006.01)
(52) U.S. Cl. .................................... 73/865.9
(58) Field of Classification Search ............... 73/865.8, 73/865.9, 104, 105, 1.89
See application file for complete search history.

(56) References Cited

U.S. PATENT DOCUMENTS

| | | | | |
|---|---|---|---|---|
| 4,011,004 A | * | 3/1977 | Levine et al. ............... | 359/393 |
| 5,959,461 A | * | 9/1999 | Brown et al. ............... | 324/765 |
| 6,660,651 B1 | * | 12/2003 | Markle ........................ | 438/729 |
| 6,779,386 B1 | * | 8/2004 | Neo et al. .................... | 73/105 |
| 6,811,466 B1 | * | 11/2004 | Swedek et al. ................ | 451/5 |
| 2004/0061779 A1 | * | 4/2004 | Harless et al. .............. | 348/125 |

FOREIGN PATENT DOCUMENTS

| | | | |
|---|---|---|---|
| JP | 10340946 A | * | 12/1998 |
| JP | 2000028538 A | * | 1/2000 |
| TW | 366549 A | * | 8/1999 |

* cited by examiner

*Primary Examiner*—Charles Garber

(57) ABSTRACT

An apparatus is provided that includes a wafer examination stand configured to securely receive a wafer carrier. In addition, the apparatus may include a measurement device suspended above stand. In some cases, the stand may include a means for positioning the wafer carrier relative to the measurement device such that a portion of the measurement device is directly above the wafer carrier in a first predetermined position and directly above the microelectronic wafer in a second predetermined position. In any case, the stand may be used for the examination of a microelectronic wafer for any circumstance in which the wafer is placed within a wafer carrier ring. For example, the stand may be used for, but not limited to, measuring the protrusion of a microelectronic wafer relative to a carrier ring. Consequently, a method for measuring a protrusion of a microelectronic wafer relative to a carrier ring is also provided.

20 Claims, 2 Drawing Sheets

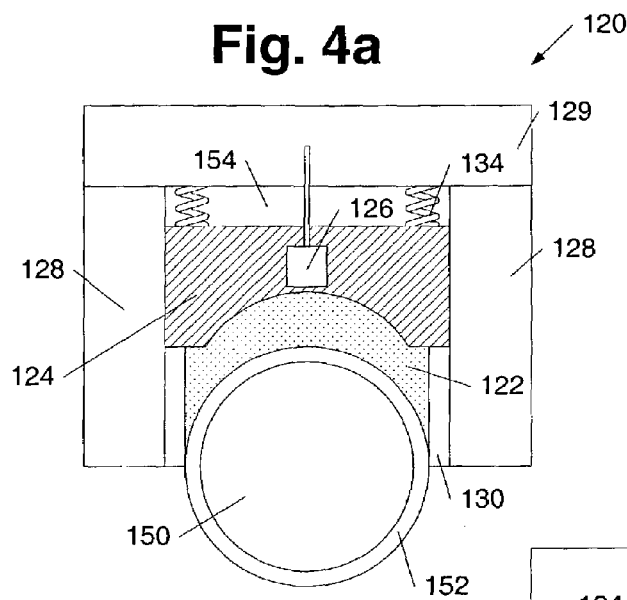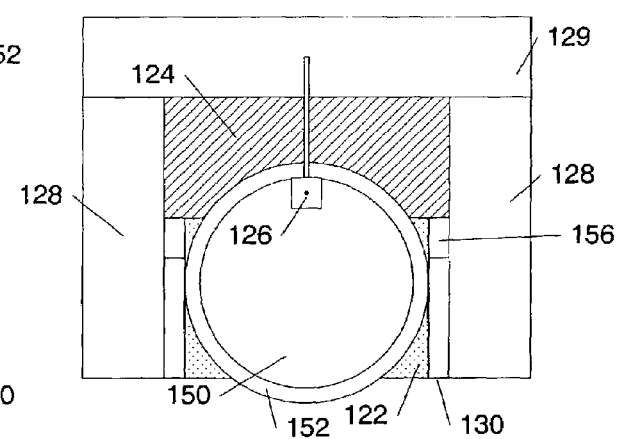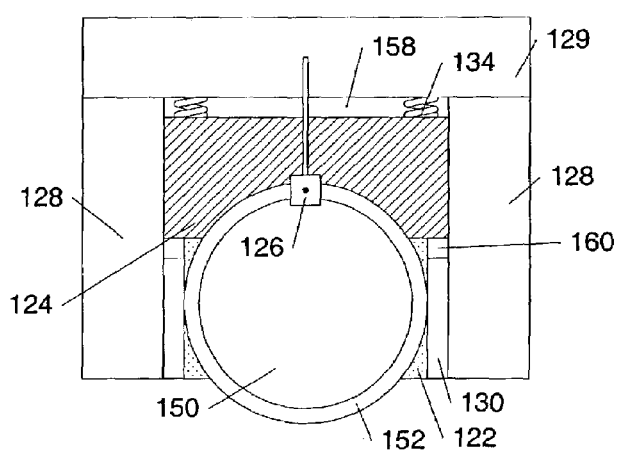

MICROELECTRONIC WAFER EXAMINATION APPARATUS AND METHOD FOR USING THE SAME

BACKGROUND OF THE INVENTION

1. Field of the Invention

This invention relates to an improved method and system for examining a microelectronic wafer, and more particularly, to an improved method and system for measuring the protrusion of a microelectronic wafer relative to a carrier ring used to hold the wafer.

2. Description of the Related Art

The following descriptions and examples are given as background only.

In many cases, elevational fluctuations in the surface of a microelectronic topography may be removed by polishing the topography. A typical polishing process may involve placing a microelectronic wafer against a carrier plate, which is surrounded by a carrier ring adapted to prevent movement of the wafer during polishing. The wafer may be pressed face-down toward an underlying polishing pad. During the polishing process, the polishing pad and/or the wafer carrier may be set in motion as the wafer is forced against the pad. In some embodiments, an abrasive, fluid-based chemical suspension, often referred to as a "slurry," may be deposited onto the surface of the polishing pad. The slurry may fill the space between the polishing pad and the wafer surface such that a chemical in the slurry may react with the surface material being polished. In addition, the movement of the polishing pad and/or wafer relative to each other may cause abrasive particles entrained within the slurry to physically strip the reacted surface material from the wafer. Alternatively, the slurry may be substantially absent of particulate matter and/or chemicals.

In general, it is beneficial for the wafer to extend from the carrier ring by a certain amount such that the carrier ring does not interfere with the polishing process (i.e., such that the carrier ring does not come into contact with the polishing pad during the polishing process). In particular, the protrusion should be large enough to allow a sufficient amount of slurry to be positioned between the wafer and polishing pad. On the other hand, the protrusion should be small enough such that the wafer is securely arranged within the wafer carrier. Since the thicknesses of the carrier plate and carrier ring may vary due to low tolerance fabrication specifications and/or warping during the polishing process, shims are often placed between the carrier ring and carrier plate in order to obtain an optimum wafer protrusion. As a consequence, the protrusion of a wafer extending from a carrier ring generally has to be measured after each wafer carrier assembly to insure that the shims position the wafer within the process specifications of the polishing system.

Unfortunately, some conventional systems used to measure the protrusion of the wafer relative to a carrier ring are not consistently accurate or precise. For example, a system which includes a distance measurement device mounted to a tripod stand may not offer a manner with which to obtain consistent protrusion measurements. In particular, such a system generally necessitates the placement of the tripod stand upon the carrier ring and wafer, causing the wafer and/or carrier ring to compress. Consequently, the resulting measurement may be distorted from the actual protrusion of the wafer relative to the carrier ring. In addition, such a system typically requires operator interface to place the tripod stand upon the carrier ring and wafer, increasing the likelihood of further compression of the carrier ring and/or wafer. Furthermore, the tripod stand may be generally unstable, since it has only three bases of support and it is placed upon the unlevel surface of the wafer and the carrier ring. Such instability of the tripod stand may undesirably cause the distance of the measurement device relative to the wafer and carrier ring to fluctuate, causing excessive variability in the protrusion measurements of the wafer.

In some embodiments, controlling the protrusion of a wafer relative to a carrier ring may further aid in controlling the polish rate of the polishing process. As stated above, the protrusion of a wafer should be large enough to allow a sufficient amount of slurry to be positioned between the wafer and polishing pad. As such, the protrusion of the wafer may be used to control the amount of slurry that is positioned between the wafer and polishing pad, to thereby control the polish rate of the polishing process. In addition, the protrusion of the wafer may be used to control the uniformity of the polishing process across the wafer. Unfortunately, as stated above, conventional methods for measuring protrusions of a wafer relative to a carrier ring may not produce accurate and precise measurements. As a result, a polishing process in which a protrusion was measured by such conventional methods may not form a substantially planar surface across an entire microelectronic topography. In particular, a microelectronic topography polished by a process in which a protrusion was measured by a conventional method may still have substantial elevational disparities. Such elevational disparities may inhibit the formation of functional microelectronic devices on the microelectronic topography. For example, a thick region of the microelectronic topography may form microelectronic devices with dimensions which deviate significantly from design specifications.

Accordingly, it would be advantageous to develop a method and system for measuring the protrusion of a wafer relative to a carrier ring. More broadly, it would be beneficial to develop a system and method for measuring relative distances upon a microelectronic wafer. In addition, it would be advantageous to develop a system which is adapted to receive and hold a microelectronic wafer without incurring additional weight upon the wafer.

SUMMARY OF THE INVENTION

The problems outlined above may be in large part addressed by an apparatus that includes a wafer examination stand configured to securely receive a wafer carrier. In addition, the apparatus may include a measurement device suspended above the stand. In some cases, the measurement device may be coupled to the stand. In yet other embodiments, the measurement device may be detached from the stand. In this manner, the stand, alone, may be used with or without the measurement device. In either case, the stand may be used for the examination of a microelectronic wafer for any circumstance in which the wafer is placed within a wafer carrier ring. For example, the stand may be used for, but not limited to, measuring the protrusion of a microelectronic wafer relative to a carrier ring. In some cases, the stand may be further adapted to rotate the carrier ring relative to the measurement device. In this manner, a plurality of protrusion measurements may be taken for a microelectronic wafer. In addition or alternatively, the stand may be adapted to interchangeably receive wafer carriers of different dimensions. Such an adaptation may be fulfilled by the inclusion of guide rails specifically configured to receive wafer carriers of particular diameters. More specifically, the stand may include guide rails laterally spaced by a dimension substantially equal to an outer diameter of a wafer carrier to be received by the stand.

In any case, the stand may further include a substantially flat platform with which to receive and support a wafer carrier comprising the carrier ring. Such a substantially flat platform may, for example, include a thickness variation of approximately 1 mm across an entirety of the platform. Consequently, in some cases, it may be advantageous for the platform to include a substantially hard surface material such that surface does not wear. For instance, in some embodiments, the substantially flat platform may include a granite surface. Furthermore, the stand may include a guide plate, in some cases, with which to guide the wafer carrier into the stand. In some embodiments, the guide plate may have a peripheral pattern which is substantially similar to a peripheral pattern of a portion of the wafer carrier. In addition, the stand may include a means for spring-loading the wafer carrier into predetermined positions. In particular, the stand may include tracks configured to allow the guide plate to move upon an application of force along the side of the wafer carrier. In some cases, the stand may include a means for positioning the carrier ring relative to the measurement device such that a portion of the measurement device is directly above the carrier ring in a first predetermined position. In addition, the means for positioning the carrier ring may be adapted such that the portion of the measurement device is directly above the microelectronic wafer in a second predetermined position.

A method for measuring the protrusion of a microelectronic wafer relative to a carrier ring is also contemplated herein. In particular, the method may include securing a carrier ring around a microelectronic wafer and suspending a measurement device above the carrier ring and the microelectronic wafer. In a preferred embodiment, the measurement device may be suspended above the carrier ring and microelectronic wafer without placing weight upon the carrier ring or the microelectronic wafer. In any case, the method may further include measuring a protrusion of the microelectronic wafer relative to the carrier ring. In some cases, such a measurement step may include positioning the carrier ring relative to the measurement device such that a portion of the carrier ring is directly below the measurement device in a first predetermined position and a portion of the microelectronic wafer is directly below the measurement device in a second predetermined position or vice versa. Alternatively, the step of measuring may include positioning the measurement device relative to the carrier ring. In either case, the method may further include positioning the carrier ring and the microelectronic wafer within an apparatus configured to securely receive the carrier ring. Furthermore, the method may include rotating the carrier ring within the apparatus such that another protrusion measurement of the microelectronic wafer relative to the carrier ring may be taken.

There may be several advantages to the method and apparatus described herein. In particular, the apparatus offers a manner in which to securely receive and support a wafer carrier. More specifically, the apparatus is specifically adapted to hold a wafer carrier such that the distance between a measurement device of the apparatus and the stand configured to hold the wafer carrier is unalterable. In addition, the apparatus and method offer a manner with which the protrusion of a wafer relative to a carrier ring may be determined. More specifically, the apparatus and method offer a manner in which to measure the protrusion of a wafer relative to a carrier ring without placing additional weight upon the wafer or carrier ring. In this manner, the wafer and carrier ring may not be compressed and, therefore, protrusion measurements taken therefrom may be accurate and precise. Moreover, the apparatus and method may be used without having to manually position the measurement device above the microelectronic wafer. In this manner, the weight variance of human contact upon the apparatus and/or microelectronic wafer may be negated.

Since more precise and accurate protrusion measurements may be obtained with the method and apparatus described herein, relatively narrow protrusion specifications may be employed for polishing processes having wafer carriers assembled using such a system and method. Consequently, the polish rate across a wafer may be more uniform in a polishing system using a wafer carrier assembled using the method and apparatus described herein than a polish rate of a polishing system using a wafer carrier assembled using conventional methods and devices. As a result, a substantially planar topography may be obtained using the method and device described herein, thereby increasing manufacturing yield and reducing production costs.

BRIEF DESCRIPTION OF THE DRAWINGS

Other objects and advantages of the invention will become apparent upon reading the following detailed description and upon reference to the accompanying drawings in which:

FIG. 2b depicts a front view of the microelectronic wafer examination stand of FIG. 2a;

FIG. 4a depicts a top view of an examination stand having a microelectronic wafer loaded therein;

FIG. 4b depicts a top view of the examination stand, wherein the microelectronic wafer is placed into a first predetermined position subsequent to being loaded in FIG. 4a; and FIG. 4c depicts a top view of the examination stand, wherein the microelectronic wafer is placed into a second predetermined position subsequent to being placed in the first predetermined position in FIG. 4b.

Figure 1:
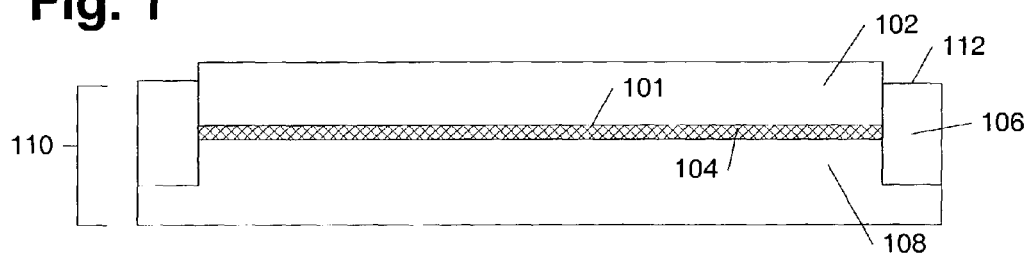
FIG. 1 depicts a partial cross-sectional view of a wafer carrier assembly holding a microelectronic wafer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2A:
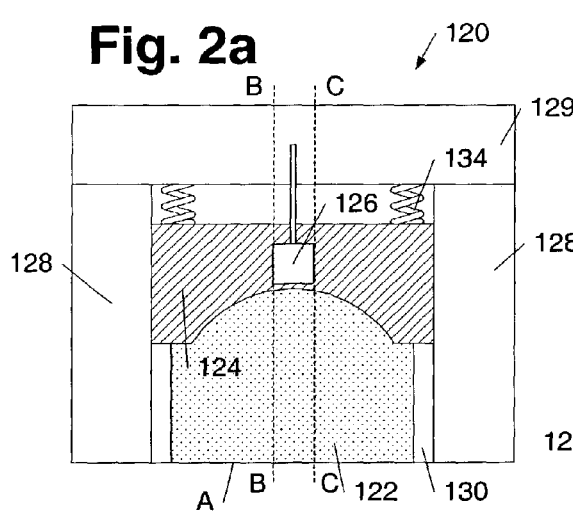
FIG. 2a depicts a top view of a microelectronic wafer examination stand.
Figure 2B:
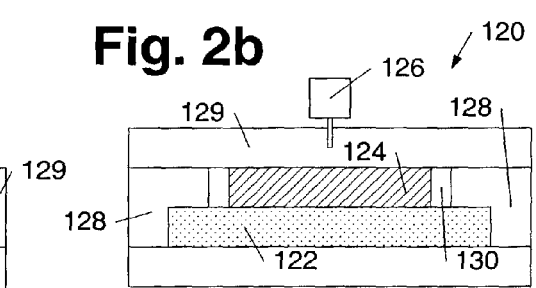
Figure 2C:
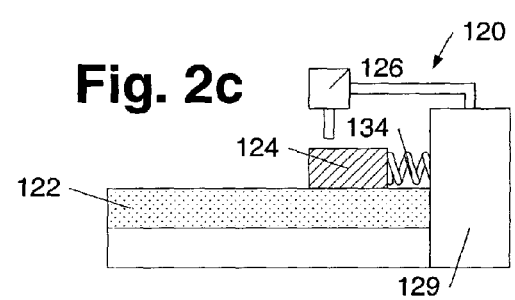
FIG. 2c depicts a partial cross-sectional view of the microelectronic wafer examination stand of FIG. 2a between dotted lines BB and CC.
Figure 3:
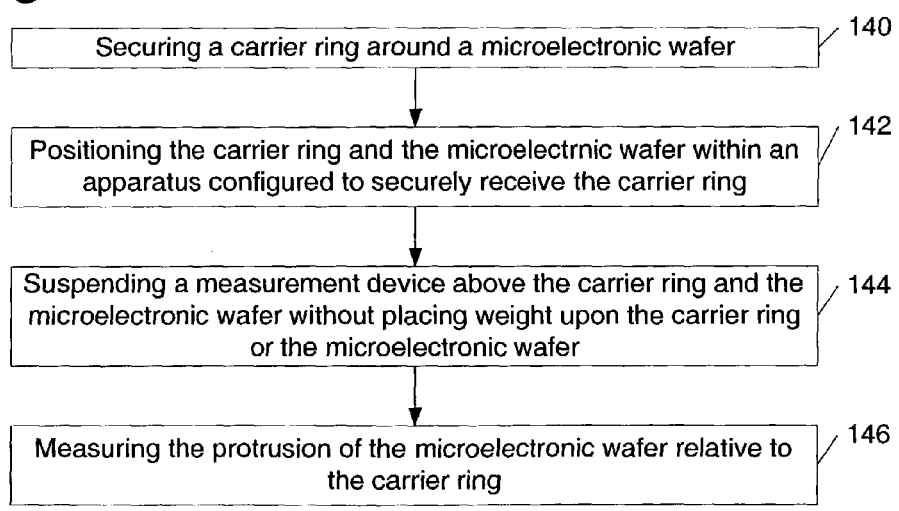
FIG. 3 depicts a flow chart for the measuring a protrusion of a wafer relative to a surrounding carrier ring.

Turning to the drawings, an exemplary embodiment of a microelectronic wafer examination stand is illustrated in FIGS. 2a–2c. An exemplary method of operation for such an examination structure is illustrated in FIGS. 4a–4c. In addition, a method for measuring a protrusion of microelectronic wafer relative to a carrier ring of a wafer carrier assembly is illustrated in FIG. 3. FIG. 1 depicts an exemplary configuration of a wafer carrier which may be placed within the microelectronic wafer examination stand described herein as well as used within the method described herein. In particular, FIG. 1 depicts wafer carrier 110, which includes carrier backing film 104, carrier plate 108, and carrier ring 106. Backing film 104 is attached to carrier plate 108 in a manner in which to receive microelectronic wafer 102. As such, microelectronic wafer 102 may be placed in wafer carrier 110 such that backing film 104 contacts at least a portion of backside surface 101 of the wafer. In addition, carrier ring 106 is preferably configured to hold microelectronic wafer 102 in alignment with backing film 104. In this manner, carrier ring 106 is adapted to encompass and hold microelectronic wafer 102.

It is noted that wafer carrier 110 is an exemplary apparatus for holding a microelectronic wafer and is merely described to portray the relative configuration of microelectronic wafer 102 and carrier ring 106. In particular, wafer carrier 110 is used to particularly describe an embodiment in which a microelectronic wafer protrudes from a carrier assembly relative to a carrier ring of the assembly as explained in more detail below. In general, the apparatus described herein may be adapted to hold any wafer carrier assembly, including those that are adapted to protrude a wafer and those that are not. Therefore, the illustration and/or description of wafer carrier 110 do not restrict the structure nor the components included within a wafer carrier that may be placed within the microelectronic wafer examination stand described herein.

In general, wafer carrier 110 may be used to hold a microelectronic wafer for any use. For instance, wafer carrier 110 may be used to hold a microelectronic wafer for examination of the wafer itself, including the layers and structures that may be formed upon the wafer. In yet other cases, wafer carrier 110 may be used to hold a microelectronic wafer against a polishing pad of a polishing system in an effort to form a substantially planar upper surface, reduce the thickness of an upper layer of the topography, and/or remove surface irregularities of the microelectronic wafer. In such an embodiment, wafer carrier 110 may be adapted to protrude a portion of microelectronic wafer 102 from exposed surface 112 of carrier ring 106 upon coupling carrier ring 106 to carrier plate 108 as shown in FIG. 1. In particular, carrier plate 108 and carrier ring 106 may be dimensionally adapted to protrude a portion of microelectronic wafer 102 within a certain tolerance of a target dimensional value.

In some cases, however, carrier plate 108 and carrier ring 106 may warp from the rotational movement of wafer carrier 110 during a polishing process. In addition or alternatively, carrier plate 108 and carrier ring 106 may be warped by over-torquing the bolts used to couple the carrier ring to the carrier plate. As such, wafer carrier 110 may need to be reassembled periodically to insert and/or replace shims (not shown) interposed between carrier ring 106 and carrier plate 108. More specifically, the shims may be used to compensate for a change in the carrier ring and/or carrier plate thickness such that a protrusion within a targeted specification range may be obtained. Such a reassembly of wafer carrier 110 may further include the replacement of other components, such as backing film 104, for example.

In general, the protrusion of microelectronic wafer 102 is preferably large enough to prevent carrier ring 106 from contacting the polishing pad during the polishing process, but small enough such that microelectronic wafer 102 may be held without sideways movement. In an embodiment in which a slurry is used during the polishing process, the protrusion is preferably large enough such that the slurry is allowed to interject between the microelectronic wafer and polishing pad. In any case, the dimensional specification of the protrusion may include a relatively small tolerance. For example, a protrusion of a microelectronic topography may be specified with a tolerance of approximately 10% of the specified target dimension. As such, in an embodiment in which the target dimension of a protrusion is specified to be approximately 0.01 inches, the protrusion of the microelectronic topography may vary between approximately 0.009 inches and approximately 0.011 inches. Larger or smaller target values and/or tolerances, however, may be specified depending on the process parameters of the polishing process and the material composition of the topography to be polished.

Consequently, wafer carrier 110 may further be used to hold a microelectronic wafer such that a target protrusion dimension may be obtained prior to using the wafer carrier in a polishing process. More specifically, wafer carrier 110 may be used to hold microelectronic wafer 102 such that the protrusion of the wafer relative to carrier ring 106 may be measured. In general, the process used to measure the protrusion of a wafer relative to a carrier ring may be conducted prior to polishing a plurality of production wafers (i.e., wafers intended for the fabrication of integrated circuits). Since the method may, in some embodiments, involve having the measurement device come in contact with the microelectronic topography, as described in more detail below, the microelectronic wafer used to measure the protrusion of a wafer within a wafer carrier may, in some embodiments, be a non-production wafer. Alternatively, however, the microelectronic wafer used to measure the protrusion of a wafer within a wafer carrier may be a production wafer. In either case, microelectronic wafer 102 may be a microelectronic substrate in some embodiments, such as a monocrystalline substrate, for example. In some cases, microelectronic wafer 102 may further include one or more layers, structures, and/or diffusion regions arranged upon the microelectronic substrate.

Illustrations of an exemplary microelectronic wafer examination stand adapted to hold a wafer carrier assembly are shown in FIGS. 2a–2c. In particular, FIG. 2a illustrates a top view of examination stand 120, FIG. 2b illustrates a front view of examination stand 120 (i.e., taken from side A of FIG. 2a), and FIG. 2c illustrates a cross-sectional view of examination stand 120 cut between dotted lines BB and CC. In general, examination stand 120 may include a means for receiving a wafer carrier assembly. For example, examination stand 120 may include guide plate 124 arranged above platform 122 as shown in FIGS. 2a–2c. In particular, examination stand 120 may be configured such that a wafer carrier assembly may be placed upon platform 122 and against guide plate 124. In some embodiments, a portion of guide plate 124 may include a peripheral pattern similar to the peripheral pattern of the microelectronic wafer to be received. More specifically, the portion of guide plate 124 adapted to receive (i.e., come into contact with) the microelectronic wafer may be curved to have a peripheral pattern substantially similar to the portion of the microelectronic wafer to be received. Such an adaptation of guide plate 124 is more clearly illustrated in FIGS. 4a–4c in which a portion of microelectronic wafer 150 is shown to be flush with guide plate 124. Alternatively, guide plate 124 may have a different peripheral pattern with which to receive a microelectronic topography.

In a preferred embodiment, platform 122 may have a substantially flat surface such that a wafer carrier placed upon the platform does not wobble. In other words, platform 122 preferably has a substantially flat surface such that a wafer carrier may be stabilized for the examination of a wafer held therein. For example, in some cases, platform 122 may include a thickness variation of approximately 1 mm across an entirety of its upper surface. Consequently, in some cases, it may be advantageous for platform 122 to comprise a substantially hard surface material such that its upper surface does not wear quickly. For instance, in some embodiments, platform 122 may include a granite surface or any other material that may exhibit hard enough properties to sustain a substantially flat surface for an extended period of time.

In some embodiments, examination stand 120 may further include guide rails 130 with which to receive a microelectronic wafer carrier. In particular, guide rails 130 may be arranged upon platform 122 spaced at a lateral distance approximately equal to the outer diameter of the carrier ring to be received. In this manner, guide rails 130 may serve to prevent the sideways movement of the microelectronic wafer carrier within examination stand 120. In some cases, the inclusion of guide rails 130 may allow examination stand 120 to be adapted to interchangeably receive wafer carriers of different dimensions. In particular, guide rails 130 may be removable such that guide rails of smaller or larger widths may be inserted into examination stand 120. In this manner, examination stand 120 may be adapted to receive microelectronic wafer carriers of different diameters, based upon the spacing between the guide plates. In another embodiment, a microelectronic wafer carrier may be loaded into examination stand 120 without the inclusion of any guide rails. In such an embodiment, sidewall casing 128 may serve to prevent the sideways movement of the microelectronic wafer carrier to be received. In any case, guide plate 124 may additionally or alternatively be replaced to make examination stand 120 adaptable to receive wafer carriers of different dimensions. In particular, guide plate 124 may be removable such that guide plates having different peripheral patterns may be loaded into examination stand 120. Such additional guide plates may have peripheral patterns specifically configured to receive microelectronic wafers with larger or smaller diameters.

As shown in FIGS. 2a–2c, examination stand 120 may include measurement device 126 suspended above guide plate 124 and platform 122. In particular, examination stand 120 may include measurement device 126 coupled to back casing 129. In other embodiments, measurement device 126 may be coupled to other components of examination stand 120, such as sidewall casings 128, for example. In yet other embodiments, measurement device 126 may be detached from examination stand 120. In either case, measurement device 126 may be fixed in a particular position or may be adapted to move. In general, measurement device 126 may include any device used in the microelectronics fabrication industry for the examination of wafers and/or circuit topographies. For example, in some cases, measurement device 126 may be configured to measure distance, particularly submillimeter distances. Consequently, measurement device 126 may include a micrometer caliper or gauge. Alternatively, measurement device 126 may be adapted to measure distance and/or thickness through light reflection or lasers.

In any case, examination stand 120 may be used to measure the protrusion of a microelectronic wafer relative to a carrier ring holding the wafer in some embodiments. In addition or alternatively, examination stand 120 may be used to measure a thickness of a structure upon the microelectronic wafer. In other cases, measurement device 126 may be adapted to measure other attributes of a wafer topography, such as but not limited to electrical conductivity, surface roughness, or lateral dimensions of structures. In such embodiments, measurement device 126 may include an instrument adapted to measure such characteristics. In yet other embodiments, examination stand 120 may not include measurement device 126. In such an embodiment, examination stand 120 may alternatively be used for visual inspection of a wafer.

In some embodiments, examination stand 120 may further include a means for positioning a microelectronic wafer within predetermined locations of the stand. More specifically, examination stand 120 may include a means for positioning a microelectronic wafer relative to measurement device 126. For example, examination stand 120 may include tracks arranged beneath guide plate 124 with which to allow the guide plate to move upon an application of force. Such tracks may be arranged above or within platform 122. In yet other embodiments, examination stand may not include such tracks and guide plate 124 may be adapted to glide along platform 122. In either case, examination stand may include springs 134 coupled to guide plate 124. In this manner, examination stand 120 may include a means for spring-loading the wafer carrier assembly into predetermined positions.

For example, upon receipt of a microelectronic wafer, springs 134 may be compressed to position the wafer in a first predetermined position. In some cases, the first predetermined position may be such that measurement device 126 is directly above the microelectronic wafer, as explained in more detail below in reference to FIG. 4b. In other cases, however, springs 134 may be configured to position a microelectronic wafer in different positions relative to measurement device 126. In either case, springs 134 may be used to position the microelectronic wafer in a second predetermined position, different from that of the first predetermined position. In some cases, the second predetermined position may be such that measurement device 126 is directly above a carrier ring holding the microelectronic wafer. However, springs 134 may also be configured to position the microelectronic wafer in different positions relative to measurement device for the second predetermined position. A more detailed description of the operation of examination stand 120 with respect to loading and positioning a microelectronic wafer within the stand is described below in reference to FIGS. 4a–4c.

In some embodiments, examination stand 120 may further or alternatively be adapted to rotate a wafer carrier arranged therein. In particular, examination stand 120 may include a means for rotating a wafer carrier such that a plurality of protrusion measurements may be taken and/or the wafer carrier can be moved to a desired location, independent of how it is loaded into the stand. Such a means for rotation may include any mechanism adapted to hold and rotate a wafer carrier. For example, platform 122 may be configured as a turntable with a locking mechanism to secure a wafer carrier in place. In other cases, guide plate 124 and/or guide rails 130 may include roller bearings arranged along the portions adapted to receive the wafer carrier assembly. In yet other embodiments, examination stand 120 may not include such a specific means of rotation, but may be configured such that a wafer carrier may rotate freely within the boundaries of guide plate 124 and guide rails 130. In other words, examination stand 120 may be configured to hold a wafer carrier in a fixed position, but also configured to spin the wafer carrier upon application of force along the periphery of the wafer carrier. In yet other embodiments, however, examination stand 120 may not be configured to rotate a wafer carrier.

FIG. 3 illustrates a flowchart of a method for measuring a protrusion of a microelectronic wafer relative to a carrier ring encompassing and holding the wafer. In particular, a method for assembling a wafer carrier may include step 140, which includes securing a carrier ring around a microelectronic wafer. In general, such a step may include positioning the microelectronic wafer within a wafer carrier, as described above in reference to FIG. 1. As shown in step 142, the method may further include positioning the carrier ring and the microelectronic wafer within an apparatus configured to securely receive the carrier ring. Such an apparatus may be similar to the examination stand described in reference to FIGS. 2a–2c. In addition, the method may include suspending a measurement device above the carrier ring and the microelectronic wafer as shown in step 144. In a preferred embodiment, the measurement device may be suspended above the carrier ring and microelectronic wafer without placing weight upon the carrier ring or the microelectronic wafer. In this manner, the wafer and carrier ring may not be compressed. Consequently, the protrusion measurements of the wafer may not be distorted.

Step 146 shows the step of measuring the protrusion of the microelectronic wafer relative to the carrier ring. In some cases, such a measurement step may include moving the carrier ring relative to the measurement device such that a portion of the microelectronic wafer is directly below the measurement device in a first predetermined position. In such a first predetermined position, the distance of the microelectronic wafer from the measurement device may be measured and/or zeroed out as described in more detail below. In addition, the measurement step may include moving the carrier ring relative to the measurement device such that a portion of the carrier ring is directly below the measurement device in a second predetermined position. The distance between the carrier ring and the measurement device at such a predetermined position may be measured and, in some embodiments, compared to the distance measurement taken at the first predetermined position, to determine the wafer protrusion reading. In some cases, positioning the carrier ring in the first and second predetermined positions relative to the measurement device may be reversed. In yet other embodiments, however, step 146 may include moving the measurement device relative to the carrier ring such that the measurement device is directly above the carrier ring in a first predetermined position and the measurement device is directly above the microelectronic topography in a second predetermined position or vice-versa.

In any case, the measurement step may include zeroing out the distance between the microelectronic wafer and the measurement device, such that the distance measured between the measurement device and the carrier ring may represent the protrusion of the wafer. Alternatively, the measurement step may include zeroing out the distance between the carrier ring and the measurement device, such that the distance measured between the measurement device and the microelectronic wafer may represent the protrusion of the wafer. In yet other embodiments, the measurement step may include measuring the actual distances between the components at the first and second predetermined positions. In such an embodiment, the measurement step may include calculating the difference between the two actual measurements to obtain a protrusion reading.

In some embodiments, the method may further include rotating the carrier ring within the apparatus such that one or more protrusion measurements of the microelectronic wafer relative to the carrier ring may be taken. In particular, the method may include rotating the carrier ring within the apparatus subsequent to measuring a first protrusion reading and laterally positioning the carrier ring and/or measurement device in predetermined positions such that another protrusion measurement may be obtained. In some cases, the method may include rotating the carrier ring prior to the first protrusion reading. In this manner, the method may include measuring a protrusion along any portion of the carrier ring, independent of how the wafer carrier is loaded into the apparatus. In some cases, the method may include taking a protrusion reading at each section of a carrier ring bolted to the carrier plate of the wafer carrier assembly. In this manner, the number of protrusion readings may correspond to the number of bolts used to secure the carrier ring to the carrier plate. In general, however, the number of protrusion readings measured for a given wafer carrier may vary, depending on the specifications of the wafer carrier assembly process.

As stated above, FIGS. 4a–4c illustrate an exemplary operation of loading a microelectronic wafer within an examination stand and positioning the microelectronic wafer within the stand. In particular, FIGS. 4a–4c illustrate the loading and positioning of microelectronic wafer 150 within examination stand 120. As shown in FIGS. 4a–4c, microelectronic wafer 150 may be encompassed by carrier ring 152. Such a configuration may be similar to the configuration described in reference to FIG. 1. In general, microelectronic wafer 150 and carrier ring 152 may be loaded within examination stand 120 such that a wafer carrier assembly comprising carrier ring 152 is arranged upon platform 122 and between guide rails 130 as shown in FIG. 4a. More specifically, the wafer carrier assembly may be loaded within examination stand 120 such that an upper surface of microelectronic wafer 152 is facing measurement device 126 at a spaced distance. In this manner, measurement device 126 may be suspended above carrier ring 152 and microelectronic wafer 150 without placing weight upon the carrier ring or the microelectronic wafer. In this manner, microelectronic wafer 150 and carrier ring 152 may not be compressed. Consequently, the protrusion measurements of microelectronic wafer 150 may not be distorted.

In general, carrier ring 152 may be positioned against guide plate 124 such that the outer periphery of carrier ring 152 is flush with the indented arc pattern of guide plate 124. In some embodiments, such a lateral positioning of carrier ring 152 may continue as guide plate 124 is moved to be flush with back casing 129, as shown in FIG. 4b. As described above, such a movement of guide plate 124 may be through the use of tracks arranged beneath the guide plate and/or springs 134 coupled to the guide plate. In particular, FIGS. 4a and 4b illustrate the compression of springs 134 to bring guide plate 124 flush with back casing 129, creating space 156 between guide plate 124 and guide rails 130. FIG. 4a, in contrast, shows springs 134 extended to have guide plate 124 flush with guide rails 130, creating space 154 between guide plate 124 and back casing 129.

The compression of springs 134 as illustrated in FIG. 4b allows examination stand 120 to position microelectronic topography 150 in a predetermined position. For example, in some embodiments, the compression of springs 134 may position microelectronic topography 150 such that measurement device 126 is directly above microelectronic topography 150. In particular, the compression of springs 134 may position microelectronic topography 150 such that measurement device 126 is directly above a portion of microelectronic topography 150 near its outer edge as shown in FIG. 4b. In particular, the black dot on measurement device 126 indicates the approximate location at which the measurement device is aligned within microelectronic topography 150 for measurement. In yet other embodiments, examination stand 120 may be configured such that measurement device 126 is above another portion of microelectronic wafer 150 or above carrier ring 152 upon the compression of springs 134.

Subsequent to positioning the wafer carrier assembly such that guide plate 124 is flush with back casing 129, the wafer carrier assembly may be repositioned such that measurement device 126 is directly above another region of microelectronic wafer 150 or carrier ring 152. FIG. 4c illustrates such a positioning of the wafer carrier assembly. In particular, FIG. 4c illustrates the partial release of the compression of springs 134 to bring guide plate 124 toward guide rails 130 following its position depicted in FIG. 4b. In this manner, examination stand 120 may include a means for spring-loading the wafer carrier into predetermined positions. Such a repositioning of guide plate 124 creates space 158 between back casing 129 and guide plate 124 as well as space 160 between guide plate 124 and guide rails 130. In some embodiments, such a positioning of the wafer carrier assembly may be such that measurement device 126 is directly above carrier ring 152 as depicted in FIG. 4c. In particular, the black dot on measurement device 126 indicates the approximate location at which the measurement device is aligned within carrier ring 152 for measurement. In yet other embodiments, examination stand 120 may be configured such that measurement device 126 is above microelectronic wafer 150 upon repositioning the wafer carrier assembly.

Although, examination stand 120 is described to position microelectronic wafer 150 in only two predetermined positions, the stand may be configured to position the microelectronic wafer in more than two positions. In particular, examination stand 120 may be configured to position the microelectronic wafer in more than two lateral positions relative to measurement device 126. Such an adaptation may be provided by additional springs and/or notches with which to secure the wafer carrier assembly in other predetermined positions. In some cases, examination stand 120 may be additionally or alternatively adapted to rotate microelectronic wafer 150. In such an embodiment, examination stand 120 may be configured to position the microelectronic wafer in a plurality of rotational positions relative to measurement device 126. In this manner, multiple protrusion measurements of the microelectronic wafer relative to the carrier ring may be obtained. In addition, such a rotational adaptation may allow a protrusion reading to be measured along any portion of the carrier ring, independent of how the wafer carrier is loaded into the apparatus. In yet other embodiments, examination stand 120 may be configured to hold a microelectronic wafer in only one position. In such an embodiment, measurement device 126 may be configured to move relative to the microelectronic wafer and carrier ring such that one or more protrusion measurements may be obtained. Such an adaptation of measurement device 126 to move may be included in any embodiment of the invention as well, regardless of the number of predetermined positions the stand is configured to hold the microelectronic wafer.

In addition to providing a manner with which to secure a wafer carrier assembly and a manner with which to measure a protrusion of a microelectronic wafer relative to the carrier ring of the assembly, the examination stand described herein may aid in producing a substantially planar surface across a microelectronic wafer during a polishing process of the wafer. In particular, the method of measuring the wafer protrusion of a wafer carrier assembly within the examination stand described herein may facilitate a more uniform polish rate across microelectronic wafers that are held by the wafer carrier assembly during a polishing process. For example, the thickness variation along the upper surface of a microelectronic wafer, which has been polished by a polishing system using a wafer carrier assembly with a protrusion measured from the method described herein, may be less than approximately 10% or, more specifically, less than approximately 5%.

It will be appreciated to those skilled in the art having the benefit of this disclosure that this invention is believed to provide an apparatus for holding a wafer carrier assembly. More specifically, this invention is believed to provide an apparatus for securing a microelectronic wafer for examination. In addition, a method for measuring a protrusion of a microelectronic wafer relative to a carrier ring of a wafer carrier assembly is provided. Further modifications and alternative embodiments of various aspects of the invention will be apparent to those skilled in the art in view of this description. For example, the apparatus described herein may be used for holding a wafer carrier assembly for any purposes, including but not limited to measuring the protrusion of a microelectronic wafer relative to a carrier ring. In addition, the method and apparatus described herein may be adapted for wafers of any size (e.g., 6 inch, 8 inch, 12 inch, or larger diameter wafers). It is intended that the following claims be interpreted to embrace all such modifications and changes and, accordingly, the drawings and the specification are to be regarded in an illustrative rather than a restrictive sense.

What is claimed is:

1. An apparatus, comprising:
a measurement device adapted to measure distances; and
a stand configured to securely receive a carrier ring which is adapted to encompass and hold a microelectronic wafer, wherein the stand comprises a spring biasing means for positioning the carrier ring in different positions relative to the measurement device such that a portion of the measurement device is directly above the carrier ring in a first predetermined position and a portion of the measurement device is directly above the microelectronic wafer in a second predetermined position.

2. The apparatus of claim 1, wherein the measurement device is coupled to the stand.

3. The apparatus of claim 1, wherein the stand further comprises a substantially flat platform with which to receive and support a wafer carrier comprising the carrier ring.

4. The apparatus of claim 3, wherein the substantially flat platform comprises a thickness variation of approximately 1 mm across an entirety of the platform.

5. The apparatus of claim 1, wherein the stand is further adapted to rotate the carrier ring relative to the measurement device.

6. The apparatus of claim 1, wherein the measurement device is fixedly coupled to the stand and wherein the stand is further adapted to rotate the carrier ring relative to the measurement device.

7. The apparatus of claim 1, wherein the stand comprises a guide plate having a peripheral pattern which is substantially similar to a peripheral pattern of a portion of the carrier ring.

8. The apparatus of claim 7, wherein the stand comprises tracks configured to allow the guide plate to move upon an application of force along a side of the carrier ring.

9. The apparatus of claim 1, wherein the stand comprises guide rails laterally spaced by a dimension substantially equal to an outer diameter of the carrier ring.

10. The apparatus of claim 1, wherein the apparatus is adapted to interchangeably receive wafer carriers of different diameters.

11. A microelectronic wafer examination stand, comprising:
- a means for securely receive a carrier ring which is adapted to encompass and hold a microelectronic wafer; and
- a spring biasing means for positioning the carrier ring in different positions such that when a measurement device is placed in a fixed positioned over the microelectronic wafer examination stand a portion of the carrier ring is directly beneath the measurement device in a first predetermined position and a portion of a microelectronic wafer secured by the carrier ring is directly below the measurement device in a second predetermined position.

12. The microelectronic wafer examination stand of claim 11, further comprising a substantially flat platform with which to receive and support a wafer carrier comprising the carrier ring.

13. The microelectronic wafer examination stand of claim 12, wherein the substantially flat platform comprises a thickness variation of approximately 1 mm across an entirety of the platform.

14. The microelectronic wafer examination stand of claim 12, wherein the platform comprises a granite surface.

15. The microelectronic wafer examination stand of claim 12, wherein the platform comprises a turntable for rotating the carrier ring and a means for optionally securing the turntable.

16. The microelectronic wafer examination stand of claim 12, further comprising a guide plate having a peripheral pattern which is substantially similar to a peripheral pattern of a portion of the carrier ring.

17. The microelectronic wafer examination stand of claim 16, wherein the platform comprises tracks configured to allow the guide plate to move upon an application of force along a side of the carrier ring.

18. The microelectronic wafer examination stand of claim 16, further comprising guide rails laterally spaced by a dimension substantially equal to an outer diameter of the carrier ring.

19. The microelectronic wafer examination stand of claim 18, wherein at least one of either the guide plate or the guide rails comprise roller bearings arranged along the portions adapted to receive the wafer carrier assembly.

20. The microelectronic wafer examination stand of claim 11, wherein the microelectronic wafer examination stand is adapted to interchangeably receive wafer carriers of different diameters.

* * * * *